US007983317B2

(12) United States Patent
Bhat et al.

(10) Patent No.: US 7,983,317 B2
(45) Date of Patent: Jul. 19, 2011

(54) MQW LASER STRUCTURE COMPRISING PLURAL MQW REGIONS

(75) Inventors: Rajaram Bhat, Painted Post, NY (US); Jerome Napierala, Painted Post, NY (US); Dmitry Sizov, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 100 days.

(21) Appl. No.: 12/336,050

(22) Filed: Dec. 16, 2008

(65) Prior Publication Data

US 2010/0150193 A1     Jun. 17, 2010

(51) Int. Cl.
*H01S 5/00* (2006.01)
(52) U.S. Cl. ............... 372/45.01; 372/46.01; 372/43.01
(58) Field of Classification Search ............ 372/45.01, 372/46.01, 43.01
See application file for complete search history.

(56) References Cited

U.S. PATENT DOCUMENTS

| 4,817,103 | A | 3/1989 | Holonyak, Jr. et al. |
| 4,882,734 | A | 11/1989 | Scifres et al. ............ 372/45 |
| 5,138,626 | A * | 8/1992 | Yap ................. 372/46.016 |
| 6,570,179 | B1 | 5/2003 | Razeghi ................ 257/15 |
| 6,674,778 | B1 * | 1/2004 | Lin et al. ............. 372/46.01 |
| 7,058,105 | B2 | 6/2006 | Lee et al. |
| 2003/0231683 | A1 | 12/2003 | Chua et al. ............. 372/46 |
| 2004/0125839 | A1 | 7/2004 | Lee et al. |
| 2007/0290230 | A1 * | 12/2007 | Kawaguchi et al. ....... 257/196 |
| 2008/0095492 | A1 * | 4/2008 | Son et al. ................ 385/14 |
| 2008/0112452 | A1 | 5/2008 | Chakraborty et al. ... 372/45.011 |

FOREIGN PATENT DOCUMENTS

| EP | 0 361 603 | 4/1990 |
| EP | 1 914 813 | 4/2008 |
| EP | 1914813 A2 | 4/2008 |
| JP | 10-242512 | 9/1998 |

OTHER PUBLICATIONS

Hogan, "Spreading out laterally enables a phosphor-free white LED", photonics.com, 2008.
Schwegler et al., "Spatially resolved electroluminescense of InGaN-MQW-LED's", 1999 Fall Meeting of the Materials Research Society—Symposium W, "Gallium Nitride and Related Alloys", Boston MA, 2008.
Bhat et al., "The growth of GaInAs/InP and GaInAs/AlInAs superlattices with thin barrier layers by low pressure organometallic chemical vapor deposition", Journal of Crystal Growth, 110 (1991) 353-362.

(Continued)

*Primary Examiner* — Kinam Park
(74) *Attorney, Agent, or Firm* — Steven J. Scott; Bruce P. Watson

(57) ABSTRACT

Multi-quantum well laser structures are provided comprising active and/or passive MQW regions. Each of the MQW regions comprises a plurality of quantum wells and intervening barrier layers. Adjacent MQW regions are separated by a spacer layer that is thicker than the intervening barrier layers. The bandgap of the quantum wells is lower than the bandgap of the intervening barrier layers and the spacer layer. The active region may comprise active and passive MQWs and be configured for electrically-pumped stimulated emission of photons or it may comprises active MQW regions configured for optically-pumped stimulated emission of photons.

12 Claims, 2 Drawing Sheets

OTHER PUBLICATIONS

Feng et al., "Optical spectroscopic investigation of InGaN/GaN multiple quantum well light emitting diode wafers grown on sapphire by metalorganic chemical vapor deposition", Journal of Physics: Conference Series 28 (2006) 42-47.

Lee et al., "Optical properties of InGaN/GaN multiple quantum wells", Journal of the Korean Physical Society, vol. 41, No. 3, 2002, 386-389.

Piprek et al., "Simulation and optimization of 420 nm InGaN/GaN laser diodes", Physics and Simulation of Optoelectronic Devices VIII, SPIE Proc. 6944, 2000.

D. Hofstetter, et al., "Excitation of a Higher Order Transverse Mode in an Optically Pumped $In_{0.15}Ga_{0.85}N/In_{0.05}Ga_{0.95}N$ Multiquantum Well Laser Structure," Appl. Phys. Lett., Mar. 31, 1997, vol. 70, No. 13, pp. 1650-1652.

* cited by examiner

MQW LASER STRUCTURE COMPRISING PLURAL MQW REGIONS

BACKGROUND

1. Field

The present disclosure relates to semiconductor lasers and, more particularly, to enhanced optical confinement in laser structures.

2. Technical Background

The present inventors have recognized that, to improve the optical confinement of light propagating in the waveguide of a semiconductor laser, confined mode out-coupling to the laser substrate should be reduced or eliminated. In addition, the optical field profile around the active region of the laser should be narrowed to ensure efficient overlap between the optical propagating mode and the gain region and to prevent optical loss due to optical mode penetration into metal contacts in the vicinity of the active region. These challenges are particularly acute for semiconductor lasers operating at wavelengths between approximately 450 nm and approximately 600 nm because such lasers are often prone to optical leakage.

BRIEF SUMMARY

Semiconductor lasers may comprise optical heterostructures including, for example, a waveguide layer with higher refractive index sandwiched between two cladding layers with an index of refraction lower than that of the waveguide. The cladding layers serve to narrow the optical mode width and the mode decays exponentially in the cladding layers because the cladding layer refractive index is lower than the waveguide effective refractive index. The greater the difference between the effective refractive index $n_{eff}$ of the waveguide and the refractive index of the cladding layer, the less the mode penetration in the cladding and the narrower the mode. Thus, a narrow mode can be achieved either by increasing the refractive index in the waveguide or by decreasing the refractive index of cladding.

If the effective refractive index $n_{eff}$ of the waveguide is lower than the refractive index of the substrate, then tunneling of light through the bottom cladding into the substrate is probable. To reduce this probability, the difference between $n_{eff}$ and the cladding layer refractive index should be as large as possible. Ideally, one needs to have the cladding layer as thick as possible and to have $n_{eff}$ close to or higher than the substrate index. Unfortunately, in the context of Group III nitride semiconductor lasers, the lattice-mismatch induced strain in the heterostructure and the thermal instability of InGaN place significant design constraints on the laser. For example, it is challenging to grow an AlGaN cladding layer that is thick enough and has a high enough Al content to reduce cladding layer refractive index because AlGaN tensile strain generates cracking issues in the structure. It is also difficult to grow an InGaN heterostructure that has a sufficient In content because of factors like high compressive strain, poor thermal stability, and difficulties in doping the material.

The present inventors have also recognized that reductions in the cladding layer refractive index will not yield a high waveguide effective refractive index $n_{eff}$, relative to the refractive index of the laser substrate, because, according to optical confinement physics, reductions in the cladding layer refractive index lead to reductions of the waveguide effective refractive index $n_{eff}$. According to the subject matter of the present disclosure, the effective refractive index $n_{eff}$ of the waveguide region of a semiconductor laser operating, for example, at lasing wavelengths greater than 450 nm, can be increased to enhance optical confinement in the laser structure by introducing a plurality of MQW regions in the laser structure. This enhanced optical confinement reduces mode leakage to the laser substrate and helps prevent optical loss due to optical mode penetration into metal contacts in the vicinity of the active region of the laser structure. For example, where a contact metal is deposited on the top of the upper cladding layer of the laser structure, even slight mode tail penetration into the metal layer through the upper cladding layer can be a source of significant optical losses because absorption in the metal can be extremely high. The aforementioned increases in the effective refractive index $n_{eff}$ of the waveguide region can reduce this mode tail penetration.

In accordance with one embodiment of the present disclosure, a multi-quantum well laser diode is provided comprising a laser substrate, a semiconductor active region, a waveguide region, and a cladding region. The active region comprises at least one active MQW region and at least one passive MQW region. The active MQW region is configured for electrically-pumped stimulated emission of photons. The passive quantum well region is optically transparent at the lasing photon energy of the active MQW region. Each of the MQW regions comprises a plurality of quantum wells and intervening barrier layers of barrier layer thickness a. Adjacent MQW regions are separated by a spacer layer of spacer thickness b. The spacer thickness b is larger than the barrier layer thickness a. The bandgap of the quantum wells is lower than the bandgap of the intervening barrier layers and the spacer layer. The respective active, waveguide, and cladding regions are formed as a multi-layered diode over the laser substrate such that the waveguide region guides the stimulated emission of photons from the active region, and the cladding region promotes propagation of the emitted photos in the waveguide region.

In accordance with another embodiment of the present disclosure, a multi-quantum well laser structure is provided where the active region comprises one or more active MQW regions configured for optically-pumped stimulated emission of photons. Each of the MQW regions comprises a plurality of quantum wells, which comprise a bandgap-reducing Group III nitride component, and intervening nitride barrier layers of barrier layer thickness a. Adjacent MQW regions are separated by a nitride spacer layer of spacer thickness b. The spacer thickness b is larger than the barrier layer thickness a. The bandgap of the quantum wells is lower than the bandgap of the intervening nitride barrier layers and the nitride spacer layer. The respective active, waveguide, and cladding regions form a multi-layered structure over the laser substrate such that the waveguide region guides the stimulated emission of photons from the active region, and the cladding region promotes propagation of the emitted photons in the waveguide region.

In accordance with yet another embodiment of the present disclosure, the spacer thickness b is larger than the barrier layer thickness a and is between approximately 10 nm and approximately 150 nm. The barrier layer thickness a is between approximately 2 nm and approximately 30 nm.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
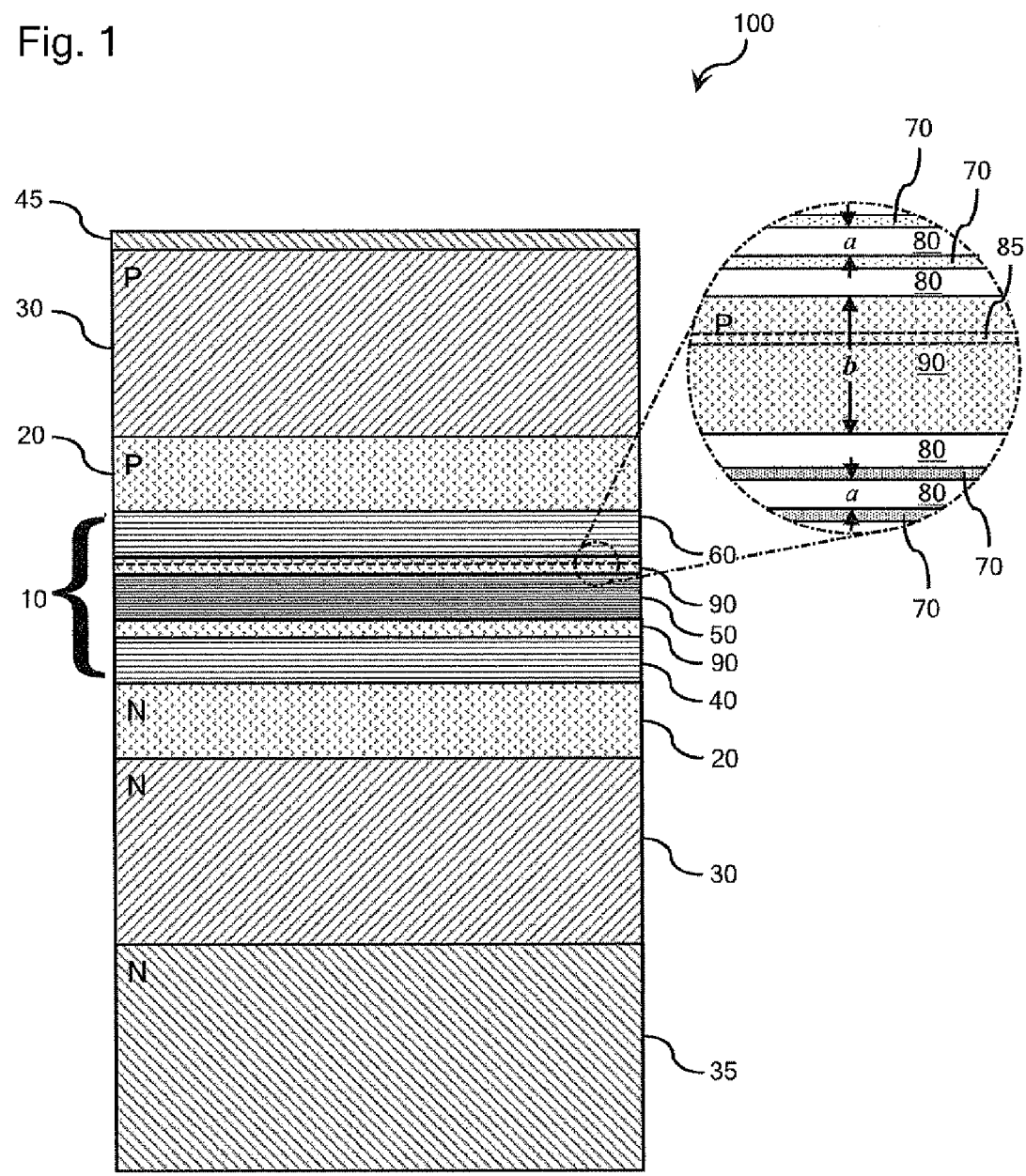
FIG. 1 is an illustration of a multi-quantum well laser structure suitable for electrical pumping according to one embodiment of the present disclosure.
Figure 2:
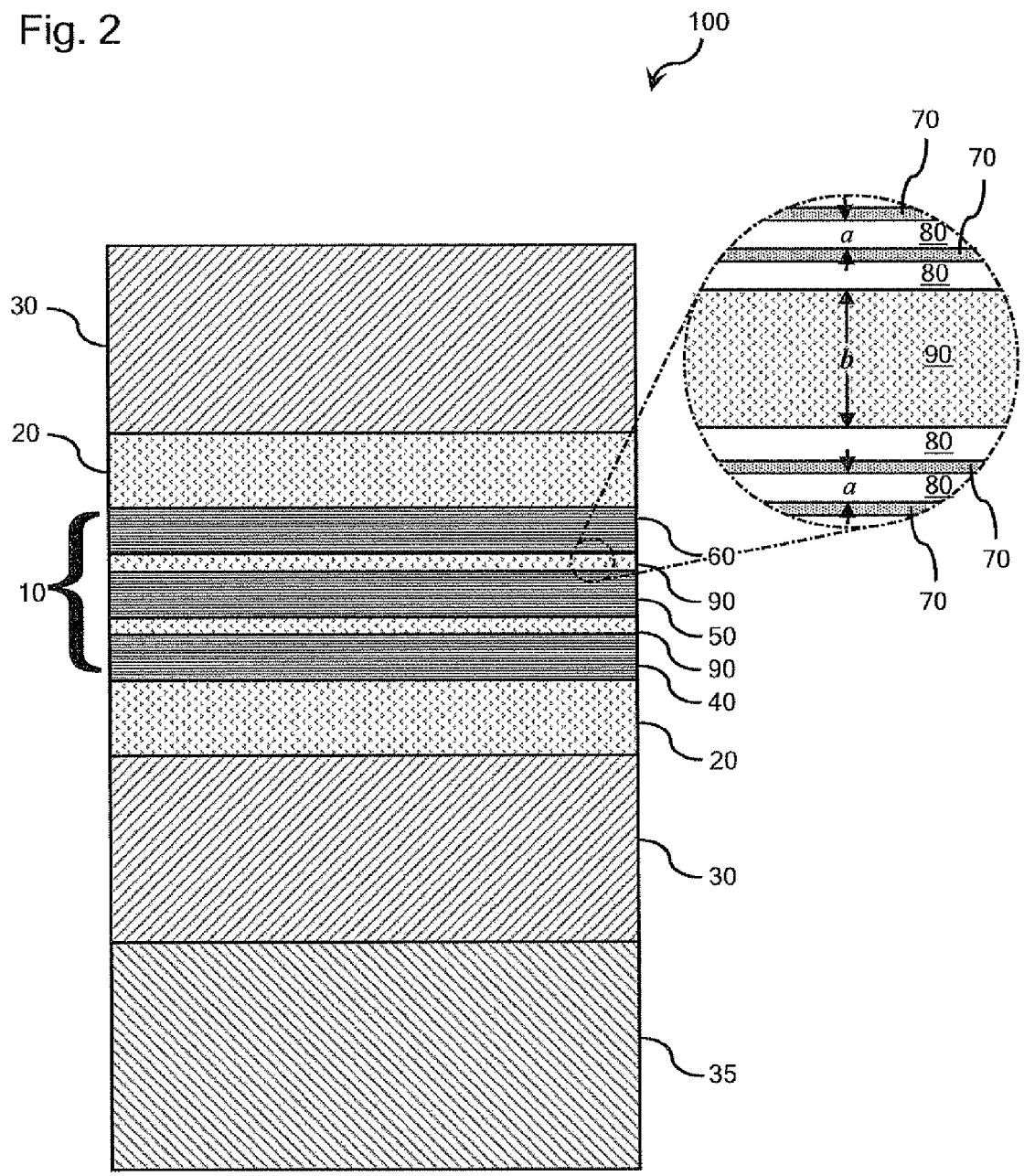
FIG. 2 is an illustration of a multi-quantum well laser structure suitable for optical pumping according to another embodiment of the present disclosure.

The multi-quantum well (MQW) laser structures 100 illustrated in FIGS. 1 and 2, comprise a semiconductor active region 10, a waveguide region comprising a pair of waveguide layers 20 disposed on opposite sides of the active region 10, and a cladding region comprising a pair of cladding layers 30 disposed on opposite sides of the waveguide region. The respective active, waveguide, and cladding regions are formed as a multi-layered structure over a laser substrate 35 such that the waveguide layers 20 of the waveguide region guide the stimulated emission of photons from the active region 10, and the cladding layers 30 of the cladding region promote propagation of the emitted photons in the waveguide region.

The active region 10 comprises a plurality of MQW regions 40, 50, 60, at least one of which is configured for stimulated emission of photons. The MQW regions 40, 50, 60 enhance optical confinement without introducing optical loss by providing a refractive index that is as high as possible at the lasing wavelength. As a result, the effective refractive index $n_{eff}$ of the waveguide, as describe above, increases and optical confinement in the laser structure is enhanced. The refractive index provided by the MQW regions 40, 50, 60 typically increases superlinearly with reductions of the bandgap of the semiconductor material used in the MQW regions 40, 50, 60. Thus, in practicing the present invention, materials with relatively low bandgaps should be used in constructing the MQW regions 40, 50, 60 to enhance optical confinement.

In electrically and optically pumped laser structures 100, including those illustrated in FIGS. 1 and 2, the active region 10 is constructed using a plurality of relatively thin quantum wells 70. Although not required, the quantum wells 70 can be fabricated using a Group III nitride selected for the aforementioned bandgap reduction. For the purposes of defining and describing the present invention, a component that reduces the bandgap when its concentration is increased will be referred to as a "bandgap-reducing" component of the quantum well. The bandgap-reducing Group III nitride component is selected such that the refractive index of the quantum well 70 at the stimulated emission wavelength can be increased super-linearly as the concentration of the bandgap-reducing Group III nitride component of the quantum well 70 is increased. For example, according to one embodiment, the quantum wells 70 comprise InGaN quantum wells, which are typically grown under compressive strain on GaN substrates or buffer layers, and the concentration of the InN component of the InGaN is increased to create a superlinear increase in the refractive index. In contrast, if the concentration of the GaN component of the InGaN is increased, it does not reduce the bandgap of the quantum well and, as such, this component is not generally considered to be a bandgap-reducing component of the quantum well. In another embodiment, the quantum wells 70 comprise AlGaN quantum wells grown under compressive strain on AlGaN or AlN substrates. For InGaN quantum wells 70, the bandgap-reducing Group III nitride component would be InN with the reduced bandgap discussed above. For AlGaN quantum wells 70, the bandgap-reducing Group III nitride component would be GaN with the reduced bandgap discussed above. AlGaAs quantum wells, AlGaAsP quantum wells, GaAs quantum wells, InGaAs quantum wells and combinations thereof are also contemplated.

As is noted above, the refractive index of the MQW regions 40, 50, 60 increases superlinearly with increases in the concentration of the bandgap-reducing component of the quantum well. However, compressive strain in the semiconductor layers utilizing the bandgap-reducing component merely accumulates in a relatively linear fashion as the concentration of the component and the thickness of the layers utilizing the component increases. As a result, in order to benefit from the higher refractive index, and the better optical confinement provided thereby, without increasing total strain, it is preferable to use thinner layers with higher bandgap-reducing component concentrations, as opposed to single, relatively thick layers with relatively low bandgap-reducing component concentrations. Although compressive strain in the waveguide region 10 typically accumulates almost linearly as the content of the bandgap-reducing component increases, optical confinement can be enhanced without sacrificing structural integrity by decreasing the thickness of the relatively thin quantum wells 70 while increasing the content of the bandgap-reducing component in the quantum wells 70. As a result, the MQW regions 40, 50, 60, which also comprise intervening barrier layers 80, represent a relatively compact waveguide region 10 that concentrates the propagating optical mode in a relatively narrow region.

In practicing the various embodiments disclosed herein, it should be recognized that, although quantum wells 70 with a lower bandgap generally increase optical confinement in the quantum wells 70, the composition of the MQW regions 40, 50, 60 should be held such that it would not yield excessive compressive strain accumulation or deterioration of the growth morphology, which, for example, often results in the formation of v-pits in the structure. To help address these issues while permitting a low bandgap in the MQW regions 40, 50, 60, adjacent MQW regions 40, 50, 60 are separated by spacer layers 90 fabricated with a larger bandgap material. The bandgap of the quantum well 70 is lower than the respective bandgaps of the intervening nitride barrier layers 80 and the spacer layer 90. Although it is contemplated that laser structures within the scope of the present disclosure may employ a variety of conventional and yet-to-be developed nitrides or other materials that yield the aforementioned characteristics, in one embodiment, the MQW regions 40, 50, 60 comprise InGaN and the spacer layers 90 comprise GaN or InGaN.

As is illustrated schematically in FIGS. 1 and 2, the spacer layers 90 define a spacer thickness b that is larger than the barrier layer thickness a. The spacer layers 90 may be of nanometer-scale but should be sufficiently thick to at least partially mitigate strain accumulation across the MQW regions 40, 50, 60 and to recover any morphology deterioration introduced during MQW growth. For example, in some embodiments, the spacer thickness b can be larger than the barrier layer thickness a. More specifically, where the spacer thickness b is between approximately 20 nm and approximately 100 nm, the barrier layer thickness a can be between approximately 2 nm and approximately 30 nm. In other embodiments, the spacer thickness b is at least twice as large as the barrier layer thickness a. In still other embodiments, the spacer thickness b is greater than approximately 20 nm and the barrier layer thickness a is less than approximately 20 nm.

In the electrically pumped MQW laser structure 100 illustrated in FIG. 1, the respective active, waveguide, and cladding regions are formed as a multi-layered laser diode and the active region 10 comprises an active MQW region 50 sandwiched between a pair of passive MQW regions 40, 60. The active MQW region 50 is configured for electrically-pumped stimulated emission of photons. To ensure that the optical transition energy of the passive quantum well regions 40, 60 is higher than the lasing photon energy of the laser structure 100 and that the passive quantum well regions 40, 60 are optically transparent at the lasing photon energy of the active MQW region 50, the bandgap of the passive MQW regions 40, 60 needs to be as close as possible but higher than the lasing emission photon energy of the active MQW region 50. As will be appreciated by those familiar with semiconductor structures, the respective quantum well optical transition energies of the active and passive MQW regions 40, 50, 60 can be tailored in a variety of ways. For example, in the context of an InGaN/GaN MQW region, the quantum well optical transition energy can be tailored by adjusting the InN mole fraction in InGaN.

Accordingly, as is illustrated in Table 1 below, to ensure transparency of the passive MQW regions 40, 60 in cases where the MQW regions comprise InGaN, the In content of the active quantum well region 50 can be tailored to be greater than the In content of the passive quantum well regions 40, 60 if the quantum well thickness is the same. In this manner, the optical transition energy of the passive quantum well regions 40, 60 can be made higher than the lasing photon energy of the multi-quantum well laser structure 100 and the passive quantum well regions 40, 60 will be transparent at the lasing photon energy of the multi-quantum well laser structure. The material refractive index of the passive MQW regions 40, 60 of the electrically pumped laser diode structure 100 of FIG. 1 increases superlinearly with bandgap decrease. Generally, the bandgap cannot be less than the point at which the wavelength of the absorption edge of the MQW regions 40, 60 approaches the wavelength of laser emission, i.e., the absorption photon energy of the MQW regions 40, 60 has to be higher than lasing photon energy. In some embodiments, for example, the lasing photon energy of the active quantum well region will be approximately 50 meV to approximately 400 meV lower than the photon energy of the passive quantum well regions. Table 1, below, presents some specific design parameters suitable for practicing particular embodiments of the present invention in the context of an electrically pumped laser structure.

TABLE 1

(components listed from top to bottom, as illustrated in FIG. 1).

| Layer | Thickness | Composition | Doping | Notes |
| --- | --- | --- | --- | --- |
| contact layer 45 | 100 nm | GaN | p$^{++}$ doped | |
| cladding layer 30 | >500 nm | AlGaN or AlGaN/GaN SL, AlN average mole fraction 0-20% | p-doped | |
| Waveguide 20 | 0-150 nm | (In)GaN, InN mole fraction 0-10% | p-doped | |
| passive MQW 60 | InGaN thickness 1-10 nm, GaN thickness 2-30 nm | InGaN/GaN, InN mole fraction in InGaN is 5-30% | p-type | passive InGaN transition energy 50-400 meV higher than lasing photon energy |
| spacer 90 | 10-100 nm | (In)GaN, InN mole fraction 0-10% | Partially p-doped, or undoped | AlGaN electron stop layer in, above, or below this layer |
| Active MQW 50 | InGaN thickness 1-10 nm, GaN thickness 2-30 nm | InGaN/GaN, InN mole fraction in InGaN is 10-50% | GaN barriers can be n-doped | |
| spacer 90 | 10-100 nm | (In)GaN, InN mole fraction 0-10% | n-doped | |
| passive MQW 40 | InGaN thickness 1-10 nm, GaN thickness 2-30 nm | InGaN/GaN, InN mole fraction in InGaN is 5-30% | n-type | passive InGaN transition energy 50-400 meV higher than lasing photon energy |
| waveguide 20 | 0-150 nm | (In)GaN, InN mole fraction 0-10% | n-doped | |
| cladding layer 30 | >500 nm | AlGaN or AlGaN/GaN super lattice, AlN mole fraction 0-20% | n-doped | |
| substrate 35 | varies | GaN | n-doped | |

It is noted that the laser diode structure illustrated in FIG. 1 may further comprise an electron stop layer 85 interposed between the active and passive MQW regions 50, 60. The electron stop layer 85 could, for example, be positioned in the spacer layer 90, as is illustrated in FIG. 1, between the spacer layer 90 and the active MQW region 50, or between the spacer layer 90 and the passive MQW region 60. For laser diode structures employing InGaN MQW regions 40, 50, 60, the electron stop layer 85 can be made of p-doped AlGaN. If the spacer layer 90 is fully or partially above the electron stop layer 85, the spacer material above the electron stop layer 85 should be p-doped.

As is illustrated in FIG. 1 and Table 1, in one embodiment, the waveguide region comprises P-doped and N-doped layers 20 disposed on opposite sides of the active region 10. The cladding region also comprises P-doped and N-doped cladding layers 30 disposed on opposite sides of the active region 10. As such, the active MQW 50 is disposed between a p-doped side of the laser diode structure 100 and an n-doped side of the laser diode structure 100. The spacer layers 90 on the n-doped side of the laser diode structure 100 are fully or partially n-doped, while the spacer layers 90 on the p-doped side of the laser diode structure 100 are fully or partially p-doped. The intervening barrier layers 80 between the quantum wells 70 on the n-doped side of the laser diode structure 100 can be n-doped, while the intervening barrier layers 80 between quantum wells 70 on the p-doped side of the laser diode structure 100 can be p-doped to ensure good carrier transport through the passive MQW regions 40, 60. It is contemplated that the quantum wells 70 may also be n or p-doped in a manner consistent to that which is described for the barrier layers 80.

In the optically pumped MQW laser structure 100 illustrated in FIG. 2, the active region 10 comprises one or more active MQW regions 40, 50, 60 configured for optically-pumped stimulated emission of photons. The MQW regions 40, 50, 60 of the laser structure 100 illustrated in FIG. 2 can be substantially identical and, as such, the laser structure 100 of FIG. 2 is suitable for use as an optically pumped laser structure because each of the MQW regions 40, 50, 60 can function as an active MQW region, although it is contemplated that one or more of the MQW regions 40, 50, 60 may be passive.

Each of the MQW regions 40, 50, 60 in the optically pumped MQW laser structure 100 illustrated in FIG. 2 comprises a plurality of quantum wells 70 formed using a Group III nitride semiconductor material and intervening nitride barrier layers 80 of barrier layer thickness a. Adjacent MQW regions are separated by a nitride spacer layer 90 of spacer thickness b. The spacer thickness b is larger than the barrier layer thickness a and the bandgap of the quantum wells 70 is lower than the respective bandgaps of the intervening nitride barrier layers 80 and the nitride spacer layer 90. As is the case with the electrically pumped laser diode structure 100 illustrated in FIG. 1, the respective active, waveguide, and cladding regions of the laser structure 100 illustrated in FIG. 2 form a multi-layered structure where the waveguide layers 20 of the waveguide region guide the stimulated emission of photons from the active region 10, and the cladding layers 30 of the cladding region promote propagation of the emitted photons in the waveguide region.

Typically, the respective active, waveguide, and cladding regions are formed from undoped semiconductor material layers because the laser structure is optically pumped, as opposed to being electrically pumped. Of course, it is contemplated that some level of doping in the semiconductor material layer could be tolerated as long as the doping does not lead to excessive optical loss. The respective compositions of the active MQW regions can be functionally equivalent and any or each of the active MQW regions 40, 50, 60 can be configured to be capable of lasing under optical pumping at a common wavelength.

As is illustrated in detail in Table 2, below, for some embodiments of the optically pumped laser structure 100, the spacer thickness b is between approximately 20 nm and approximately 150 nm, while the barrier layer thickness a is between approximately 2 nm and approximately 30 nm. By utilizing these thickness relationships, those practicing the presently disclosed embodiments, will find it easier to maintain a low quantum well bandgap to optimize optical confinement while avoiding the morphology degradation commonly associated with excessive compressive strain or low growth temperatures in the active region 10. Additional thicknesses are contemplated within and outside of the aforementioned ranges.

TABLE 2

(components listed from top to bottom, as illustrated in FIG. 2).

| Layer | Thickness | Composition | other |
|---|---|---|---|
| cladding layer 30 | >500 nm | AlGaN or AlGaN/GaN super lattice, AlN mole fraction 0-20% | |
| spacer 90 | 10-150 nm | (In)GaN, InN mole fraction 0-10% | |
| Active MQW 40, 50, 60 | InGaN QW thickness 1-10 nm, InGaN barrier thickness 2-30 nm | InGaN/GaN, or InGaN/InGaN InN mole fraction in InGaN QW is 10-50%. In mole fraction in barriers and spacers is 0-10% | adjacent MQWs are separated by spacer 90 |
| spacer 90 | 10-150 nm | (In)GaN, InN mole fraction 0-10% | |
| cladding layer 30 | >500 nm | AlGaN or AlGaN/GaN SL, AlN average mole fraction 0-20% | |
| substrate 35 | varies | GaN | |

Although the embodiments illustrated in FIGS. 1 and 2 show the use of three MQW regions 40, 50, 60 in a MQW laser structure, it is contemplated that enhanced optical confinement can be achieved with two or more MQW regions separated by the aforementioned spacer layer 90. In addition, it is contemplated that each MQW region may comprise any number of quantum wells 70, provided the quantum wells are separated by the intervening barrier layer 80. It is also noted that the embodiments described and contemplated herein can be used in both Al-free laser structures and structures with AlGaN cladding layers.

For the purposes of describing and defining the present invention, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters. In addition, reference herein to "Group III" elements is intended to refer to boron (B), aluminum (Al), gallium (Ga), indium (In), thallium (Tl), and ununtrium (a synthetic element in the periodic table that has the temporary symbol Uut and has the atomic number 113).

It is noted that recitations herein of a component of the present disclosure being "configured" to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention, it is noted that the term "approximately" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

It is specified that the p-side of the structure is referred to as "top" and n-side as "the bottom" of the structure. According to this the term "above" means toward the structure top and "below" means toward the structure bottom.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects. For example, although the laser structures described herein are, in some cases, identified as comprising a Group III nitride where the bandgap-reducing Group III nitride component is InN, it is contemplated that the laser structure may include any number of group III components, regardless of whether they are capable of reducing the bandgap of the quantum well.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A multi-quantum well laser diode comprising a laser substrate, a semiconductor active region, a waveguide region, and a cladding region, wherein:

the active region comprises at least one active MQW region and at least one passive MQW region;

the active MQW region is configured for electrically-pumped stimulated emission of photons;

the passive MQW region is optically transparent at the lasing photon energy of the active MQW region;

each of the MQW regions comprises a plurality of quantum wells and intervening barrier layers of barrier layer thickness a;

each of the MQW regions is positioned in a plane that is displaced from and parallel to planes of adjacent MQW regions;

adjacent MQW regions are separated by a spacer layer of spacer thickness b;

the spacer thickness b is larger than the barrier layer thickness a;

the bandgap of the quantum wells is lower than the bandgap of the intervening barrier layers and the spacer layer; and the respective active, waveguide, and cladding regions are formed as a multi-layered diode over the laser substrate such that the waveguide region guides the stimulated emission of photons from the active region, and the cladding region promotes propagation of the emitted photos in the waveguide region.

2. A multi-quantum well laser diode as claimed in claim 1 wherein:

the laser diode further comprises an electron stop layer interposed between the active MQW region and the passive MQW region; and the electron stop layer is in the spacer layer, between the spacer layer and the active MQW region, or between the spacer layer and the passive MQW region.

3. A multi-quantum well laser diode as claimed in claim 1 wherein the optical transition energy of the passive MQW regions is higher than the lasing photon energy of the active MQW regions.

4. A multi-quantum well laser diode as claimed in claim 1 wherein lasing photon energy of the active MQW region will be approximately 50 meV to approximately 400 meV lower than the optical transition energy of the passive MQW regions.

5. A multi-quantum well laser diode as claimed in claim 1 wherein the quantum wells comprise InGaN quantum wells, AlGaN quantum wells, AlGaAs quantum wells, AlGaAsP quantum wells, GaAs quantum wells, InGaAs quantum wells and combinations thereof.

6. A multi-quantum well laser diode as claimed in claim 1 wherein:

the active MQW regions comprise InGaN quantum wells with an In mole fraction between approximately 10% and approximately 50%; and the passive MQW regions comprise InGaN quantum wells with an In mole fraction between approximately 5% and approximately 30%.

7. A multi-quantum well laser diode as claimed in claim 6 wherein:

the intervening barrier layers comprise GaN or InGaN barrier layers with an In mole fraction between approximately 0% and approximately 10%; and the spacer layer comprises a GaN or InGaN spacer layer with a In mole fraction between approximately 0% and approximately 10%.

8. A multi-quantum well laser diode as claimed in claim 1 wherein:
- the waveguide region comprises P-doped and N-doped layers disposed on opposite sides of the active region; and
- the cladding region comprises P-doped and N-doped layers disposed on opposite sides of the active region.

9. A multi-quantum well laser diode as claimed in claim 1 wherein:
- the active MQW is disposed between a p-doped side of the laser diode and an n-doped side of the laser diode;
- spacer layers on the n-doped side of the laser diode are fully or partially n-doped;
- spacer layers on the p-doped side of the laser structure are fully or partially p-doped;
- the intervening barrier layers between quantum wells on the n-doped side of the laser diode are n-doped; and
- the intervening barrier layers between quantum wells on the p-doped side of the laser diode are p-doped.

10. A multi-quantum well laser diode as claimed in claim 9 wherein:
- the laser diode further comprises an electron stop layer in the spacer layer interposed between the active MQW region and the passive MQW region;
- the portion of the spacer layer between the electron stop layer and the passive MQW region is p-doped while the portion of the spacer layer between the electron stop layer and the active MQW region is undoped.

11. A multi-quantum well laser diode as claimed in claim 1 wherein the nitride spacer layer is sufficiently thick to at least partially mitigate strain accumulation across the MQW regions or at least partially recover the surface morphology.

12. A multi-quantum well laser diode as claimed in claim 1 wherein the active MQW region is configured for lasing wavelength more than approximately 450 nm.

* * * * *